United States Patent
Kim et al.

(10) Patent No.: US 7,343,673 B2
(45) Date of Patent: Mar. 18, 2008

(54) ELECTROMAGNETIC INTERFERENCE SHIELDING FILTER MANUFACTURING METHOD THEREOF

(75) Inventors: Kyung Ku Kim, Seoul (KR); Hong Rae Cha, Seoul (KR); Young Sung Kim, Yongin-si (KR); Myeong Soo Chang, Kyunggi-do (KR); Byung Gil Ryu, Seoul (KR)

(73) Assignee: LG Electronics Inc., Seoul (KR)

( * ) Notice: Subject to any disclaimer, the term of this patent is extended or adjusted under 35 U.S.C. 154(b) by 739 days.

(21) Appl. No.: 10/821,304

(22) Filed: Apr. 9, 2004

(65) Prior Publication Data

US 2004/0222003 A1 Nov. 11, 2004

(30) Foreign Application Priority Data

Apr. 10, 2003 (KR) ................. 10-2003-0022682

(51) Int. Cl.
*H01R 43/00* (2006.01)

(52) U.S. Cl. ........................... 29/825; 29/592.1

(58) Field of Classification Search ............ 174/35 MS, 174/35 R; 361/816, 818; 29/592.1, 825
See application file for complete search history.

(56) References Cited

U.S. PATENT DOCUMENTS 4,760,456 A * 7/1988 Liang ........................ 348/820
2004/0231873 A1 * 11/2004 Shimamura et al. ... 174/35 MS

* cited by examiner

*Primary Examiner*—Hung V. Ngo
(74) *Attorney, Agent, or Firm*—Lee, Hong, Degerman, Kang & Schmadeka

(57) ABSTRACT

An electromagnetic interference (EMI) shielding filter includes a conductive pattern for shielding electromagnetic waves; and blackened layers formed on a surface of the conductive pattern. The electromagnetic interference (EMI) shielding filter is manufactured by preparing a base film; forming on the base film a first blackened layer, a conductive layer, and a second blackened layer in sequence; and patterning the first blackened layer, the conductive layer, and the second blackened layer by using a same mask, and forming on front and rear surfaces of an EMI shielding layer a conductive pattern comprising the first and second blackened layers.

2 Claims, 7 Drawing Sheets

ELECTROMAGNETIC INTERFERENCE SHIELDING FILTER MANUFACTURING METHOD THEREOF

BACKGROUND OF THE INVENTION

1. Field of the Invention

The present invention relates to an electromagnetic interference shielding filter and a manufacturing method thereof, in which the surface of an electromagnetic interference shielding layer is melanized (or blackened) to improve contrast ratio.

2. Discussion of the Background Art

In general, image display devices have an electromagnetic interference (EMI) shielding filter on the front surface to shield emission of electromagnetic waves to outside. The EMI filters not only shield electromagnetic waves but also transmit visible rays, so they usually have a conductive mesh pattern. A related art conductive mesh pattern, however, reflected an external light or a visible ray from a display panel. As a result, contrast was deteriorated. This problem is apparent in a plasma display panel (hereinafter it is referred to as "PDP") that displays images by using a gas discharge.

PDPs regulate gas discharge time of each pixel on the basis of digital video data, and display an image. Typical examples of these PDPs are AC PDPs, as shown in FIG. 1, which includes three electrodes and are driven by an AC voltage.

FIG. 1 is a perspective view of a related art AC PDP. More particularly, FIG. 1 illustrates the structure of a discharge cell corresponding to a sub-pixel.

As shown in FIG. 1, the discharge cell is divided into an upper plate 15 and a lower plate 25. The upper plate 15 includes an upper substrate 10 where a sustain electrode pair 12A and 12B, an upper dielectric layer 14, and a protective film 16 are formed in sequence. The lower plate 25 includes a lower substrate 18 where an address electrode 20, a lower dielectric layer 22, a barrier rib 24, and fluorescent layers 26.

The upper substrate 10 and the lower substrate 18 are spaced out in parallel by the barrier rib 24. The sustain electrode pair 12A and 12B respectively includes a transparent electrode for transmitting visible rays, and a metal electrode for compensating resistance of the transparent electrode. The transparent electrode is relatively wider than the metal electrode. The sustain electrode pair 12A and 12B includes a scan electrode 12A and a sustain electrode 12B. The scan electrode 12A provides scan signals for determining data supply time, and sustain signals for sustaining the gas discharge. On the other hand, the sustain electrode 12B mainly provides sustain signals for sustaining the discharge. The upper dielectric layer 14 and the lower dielectric layer 22 are piled up with charges from the gas discharge. The protective film 16 protects the upper dielectric layer 14 from damages caused by a sputtering of plasma and thus, extends lifespan of the PDP and improves the emission efficiency of secondary electrons. The protective film 16 is usually made from magnesium oxide (MgO). The dielectric layers 14 and 22 and the protective film 16 lower an externally applied discharge voltage. The address electrode 20 is formed at right angles to the sustain electrode pair 12A and 12B. The address electrode 20 provides data signals for selecting cells to be displayed. The barrier rib 24 together with the upper and lower substrates 10 and 18 create a discharge space. The barrier rib 24 is formed in parallel with the address electrode 20, and prevents ultraviolet rays generated by the gas discharge from being leaked to the adjacent discharge cells. The fluorescent layer 26 is applied to the surface of the lower dielectric layer 22 and barrier rib 24, and generate one of visible rays in red, blue, or blue. The discharge space is filled with different compositions of inert gas mixtures including He, Ne, Ar, Xe, and Kr, or Excimer gas for generating ultraviolet rays.

Thusly structured discharge cell is selected by an opposing electrode discharge between the address electrode 20 and the scan electrode 12A, and sustained by a surface discharge between the scan electrode 12A and the sustain electrode 12B. Therefore, the fluorescent layer 26 is excited by ultraviolet rays generated during the sustain discharge, and visible rays are emitted to the outside of the cell. In this case, the discharge cell controls the cell's discharge sustain period, namely frequency of the sustain discharge, according to video data, and emits a light at a gray scale level.

FIG. 2 is a schematic perspective view of a PDP set including the PDP 30 of FIG. 1.

As shown in FIG. 2, the PDP set includes a case 60, a printed circuit board 50 (hereinafter, it is referred to as "PCB") housed in the case 60, a PDP 30, a glass type front filter 40, and a cover 70 connected to the case 60 and encompassing the glass type front filter 40.

As discussed before with reference to FIG. 1, the PDP 30 includes an upper plate 15 and a lower plate 25 connected to the upper plate 15.

The PCB 50 disposed on the rear surface of the PDP 30 includes a plurality of driving and control circuits for driving the sustain electrode pair 12A and 12B and the address electrode 20 formed on the PDP 30. Situate between the PCB 50 and the PDP 30 is a heat radiation plate (not shown) for radiating heat emitted from the PDP 30 and the PCB 50.

The glass type front filter 40 shields electromagnetic waves generated from the PDP 30 towards the front surface, prevents external light reflection, blocks near-infrared rays, and corrects colors. To this end, the glass type front filter 40 includes, as shown in FIG. 3, a first antireflection coating 44 attached to a front surface of a glass substrate 42, an EMI shielding filter 46, a NIR (near infrared ray) blocking film 48, a color correcting film 52, and a second antireflection coating 54, the EMI shielding film 46, the NIR blocking film 48, the color correcting film 52 and the second antireflection coating 54 being layered in cited order on the rear surface of the glass substrate 42.

The glass substrate 42 is made from a reinforced glass to support the glass type front filter 40 and to protect the front filter 42 and the PDP 30 from damages caused by external impacts. The first and second antireflection coatings 44 and 54 prevent incident light rays from outside from being reflected back to the outside and thus, improve contrast effects. The EMI shielding filter 46 absorbs electromagnetic waves generated from the PDP 30, and shields the emission of the electromagnetic waves to outside. The NIR blocking film 48 absorbs near infrared rays at a wavelength band of 800–1000 nm that are generated from the PDP 30, and blocks the emission of the near infrared rays to outside. This is how infrared rays (approximately 947 nm) generated from a remote controller are normally input to an infrared ray receiver built in the PDP set. The color correcting film 52 contains a color dye, which is used to adjust or correct colors, whereby color purity can be improved. These films 44, 46, 48, 52, and 54 are adhered to the glass substrate 42 through an adhesive or glue.

The case 60 protects the PCB 50, the glass type front filter 40 and the PDP 30 from external shocks, and shields electromagnetic waves emitted from side and rear surfaces of the PDP 30. Also, to ensure that the glass type front filter 40 is separated from the PDP 30, the case 60 is electrically connected to the EMI shielding filter 46 of the glass type front filter 40 through a support member (not shown) that supports from the rear surface of the case 60. Therefore, the case 60 and the EMI shielding filter 46 of the glass type front filter 40 are both earthed to a ground voltage, and absorb electromagnetic waves emitted from the PDP 30 and discharge them. This is how the emission of the electromagnetic waves to outside is blocked.

Lastly, the cover 70 encompasses the outside of the glass type front filter 40, and is connected to the case 60.

As discussed above, the related art PDP set includes the glass type front filter 40 for shielding electromagnetic waves and correcting optical characteristics. However, because the glass type front filter 40 includes a glass substrate made from the reinforced glass, which is relatively thick, the thickness and weight of the PDP set were increased, and the cost of manufacture was also increased.

As an attempt to solve the above-described problems, a film type front filter without a glass substrate, as shown in FIG. 4, has been suggested. The film type front filter 65 shown in FIG. 4 includes a color correcting film 68, a NIR blocking film 66, an EMI shielding filter 64, and an antireflection layer 62, each being sequentially adhered to an upper plate 15 of the PDP 30.

The antireflection coating 62 prevents incident light rays from outside from being reflected back to the outside. The EMI shielding filter 64 absorbs electromagnetic waves generated from the PDP 30, and shields the emission of the electromagnetic waves to outside. The NIR blocking film 66 absorbs near infrared rays that are generated from the PDP 30, and blocks the emission of the near infrared rays to outside. The color correcting film 68 contains a color dye, which is used to adjust or correct colors, whereby color purity can be improved. These films 62, 64, 66, and 68 are adhered to the PDP 30 through an adhesive or glue.

Both the glass type front filter 40 of FIG. 3 and the film type front filter 65 include an EMI shielding filter 46 or 64 for shielding EMI from the PDP 30. As shown in FIGS. 5 and 6, the EMI filter 46 or 64 includes an EMI shielding layer 75 formed of conductive meshes 74 and frames 72 for supporting the conductive meshes 74, and a base film 75 formed on the EMI shielding layer 75.

Referring to FIGS. 5 and 6, to form the conductive meshes 74 and the frames 72 a metal layer made from silver (Ag) or copper (Cu) for example undergoes photolithography and etching processes to be patterned. To be more specific, a metal foil is formed on the base film 76, and the metal foil is coated with a photoresist. Later, the photoresist coating is patterned by using a mask and thus, the frame and a photoresist pattern in mesh type are formed. The metal foil is patterned by using the photoresist pattern as a mask, and as a result, the EMI shielding layer 75 including the frames 72 and the conductive meshes 74 is formed on the base film 76, as illustrated in FIG. 6. Any photoresist patterns remaining on the frames 72 and the conductive meshes 74 are removed through a strip process.

The EMI shielding layer 75, namely the conductive meshes 74 and the frames 72, of the related art EMI shielding filter 46 or 64 is usually made from highly lustrous metals. Thus, an externally incident lights R1 or display lights R2 emitted from the PDP 30 are reflected by the metallic conductive meshes 74 and frames 72. These reflected lights by the EMI shielding filter 75 increases overall black level or brightness of the PDP 30, resulting in deterioration of contrast ratio.

SUMMARY OF THE INVENTION

An object of the invention is to solve at least the above problems and/or disadvantages and to provide at least the advantages described hereinafter.

Accordingly, one object of the present invention is to solve the foregoing problems by providing an electromagnetic interference shielding filter and a manufacturing method thereof, in which the surface of an electromagnetic interference shielding layer is melanized (or blackened) to improve contrast ratio.

The foregoing and other objects and advantages are realized by providing an electromagnetic interference (EMI) shielding filter, including: a conductive pattern for shielding electromagnetic waves; and blackened layers formed on a surface of the conductive pattern.

Another aspect of the invention provides a manufacturing method of an electromagnetic interference (EMI) shielding filter, the method including the steps of: preparing a base film; forming on the base film a first blackened layer, a conductive layer, and a second blackened layer in sequence; and patterning the first blackened layer, the conductive layer, and the second blackened layer by using a same mask, and forming on front and rear surfaces of an EMI shielding layer a conductive pattern comprising the first and second blackened layers.

Still another aspect of the invention provides a manufacturing method of an electromagnetic interference (EMI) shielding filter, the method including the steps of: preparing a base film; forming on the base film a first blackened layer and a conductive layer; patterning the first blackened layer and the conductive layer by using a same mask, and forming on the rear surface of an EMI shielding layer a conductive pattern comprising the first blackened layer; and forming a second, third, and fourth blackened layer for encompassing a front surface and both side surfaces of the conductive pattern.

Another aspect of the invention provides a front filter of a plasma display panel, in which the front filter includes a conductive pattern for shielding electromagnetic waves, and a base film for supporting the conductive pattern, and blacked layers are formed on a part of the conductive pattern.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The following detailed description will present an electromagnetic interference (EMI) shielding filter and a manufacturing method thereof according to a preferred embodiment of the invention in reference to the accompanying drawings.

Figure 1:
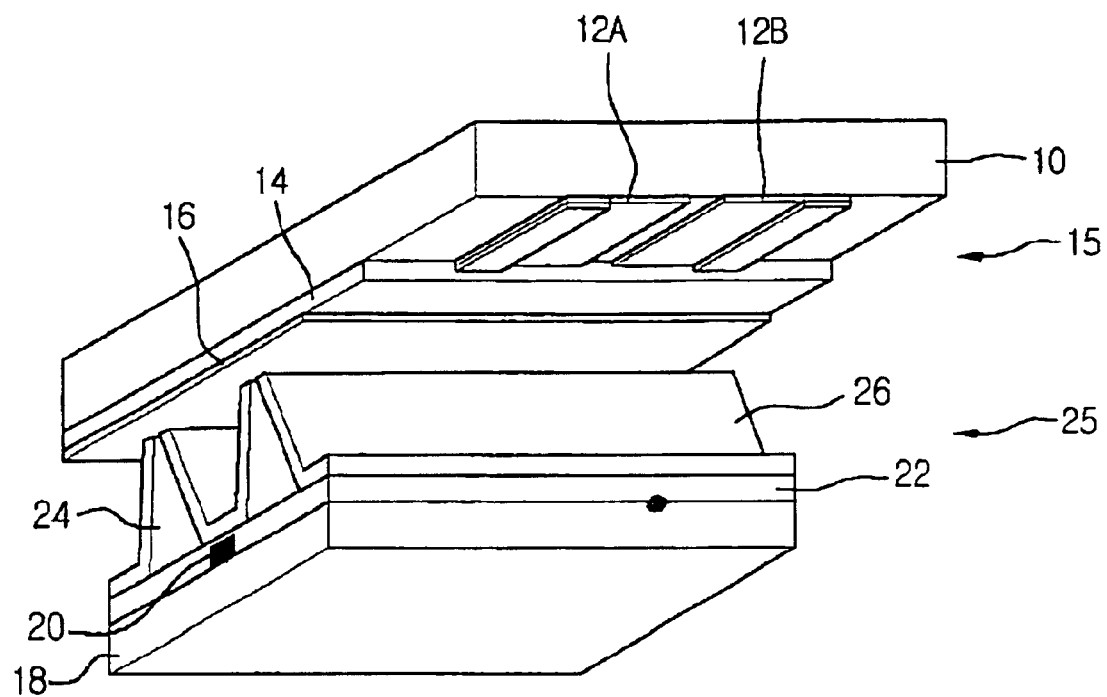
FIG. 1 is a perspective view of a related art three-electrode AC surface discharge plasma display panel (PDP)
Figure 2:
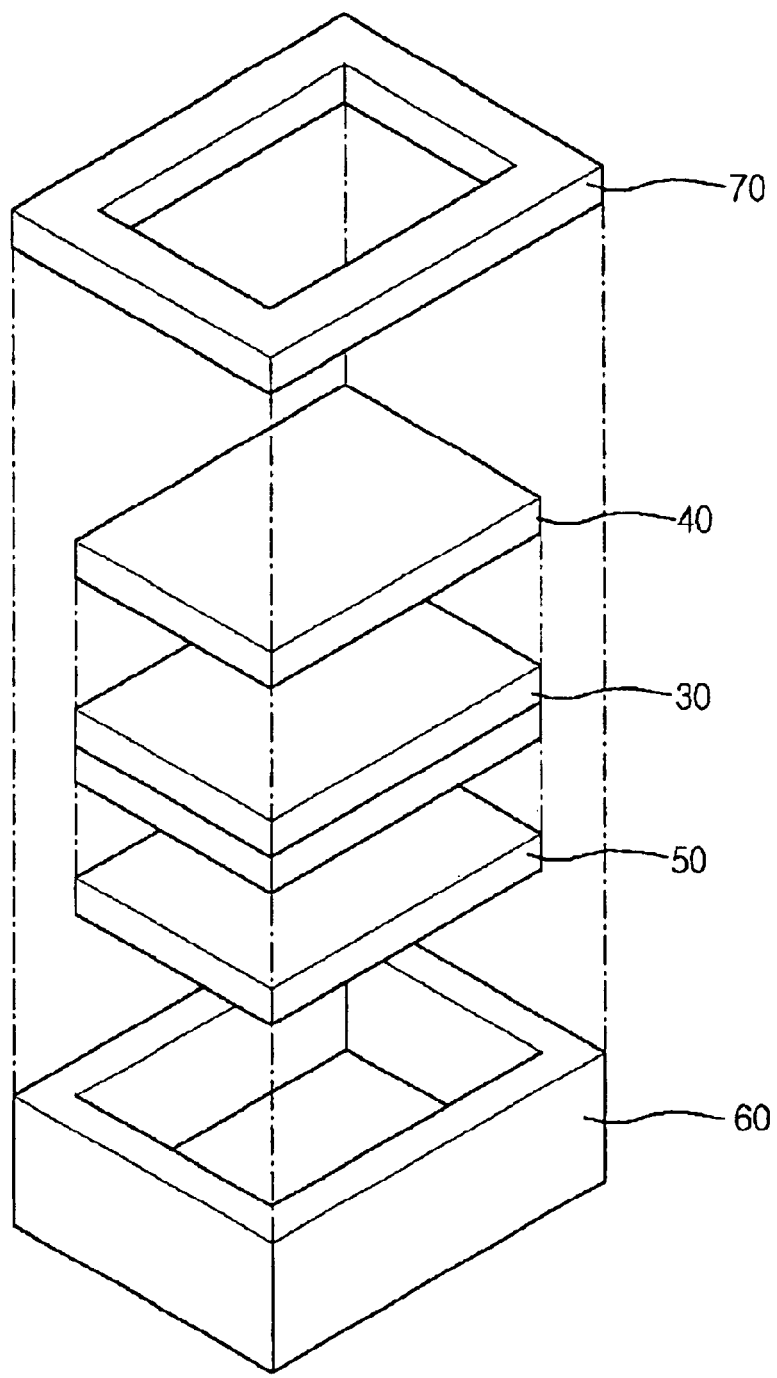
FIG. 2 is a schematic perspective view of a PDP set including a PDP of FIG. 1.
Figure 3:
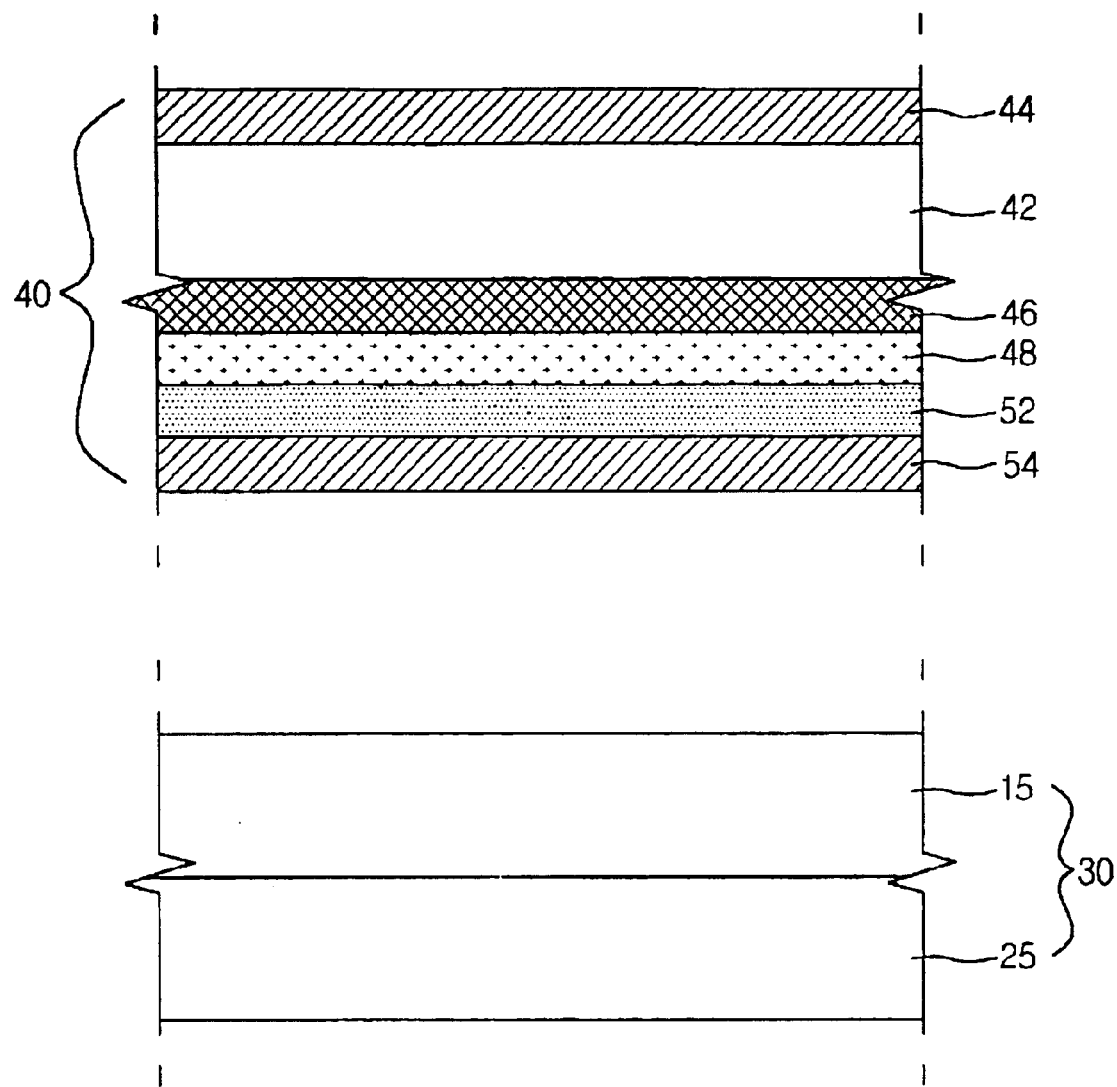
FIG. 3 is a cross-sectional view showing a vertical structure of a glass type front filter and PDP of FIG. 2, respectively.
Figure 4:
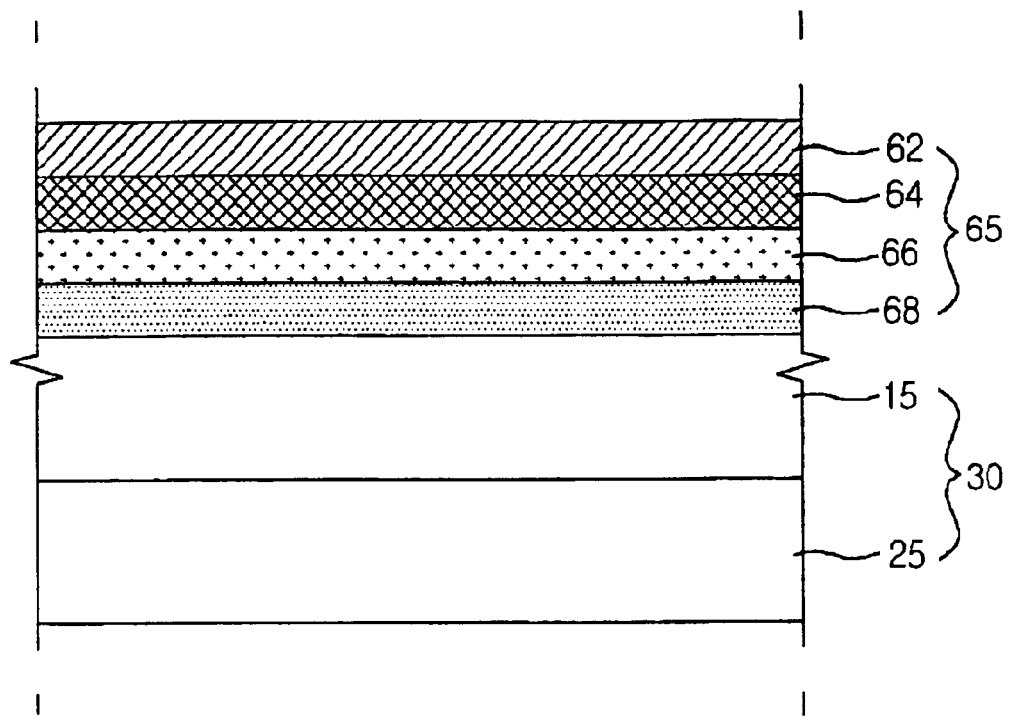
FIG. 4 is a cross-sectional view showing a vertical structure of a PDP to which a related art film type front filter is attached.
Figure 5:
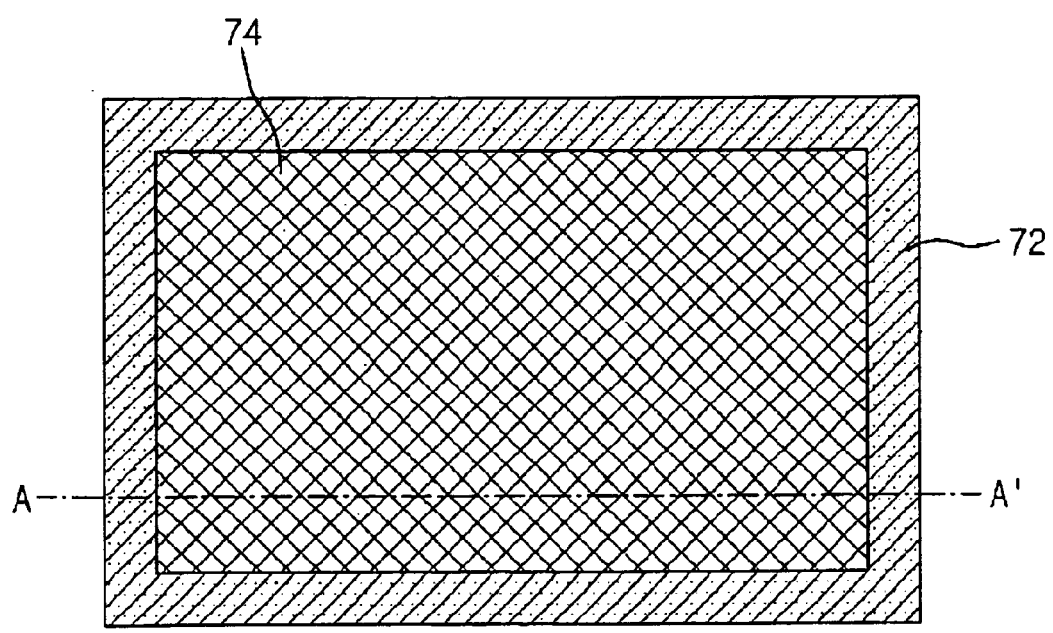
FIG. 5 is a plan view showing a detailed structure of a related art electromagnetic interference (EMI) shielding filter of FIG. 3 and FIG. 4.
Figure 6:
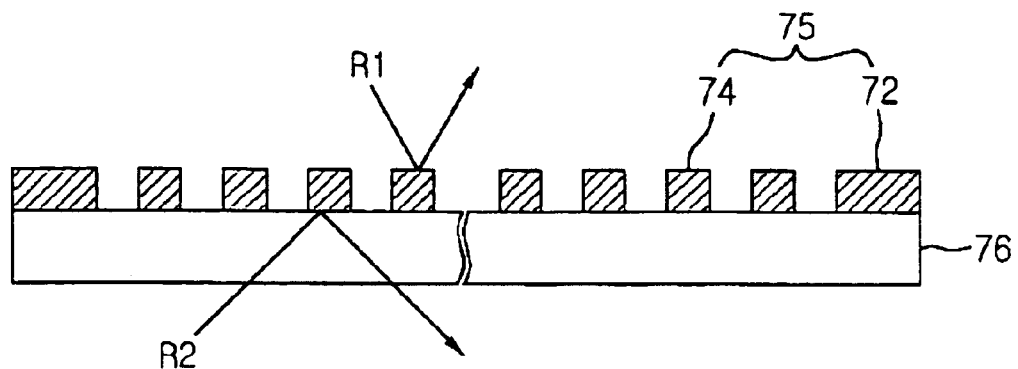
FIG. 6 is a cross-sectional view of a related art EMI shielding filter, taken along line A–A' in FIG. 5.
Figure 7:
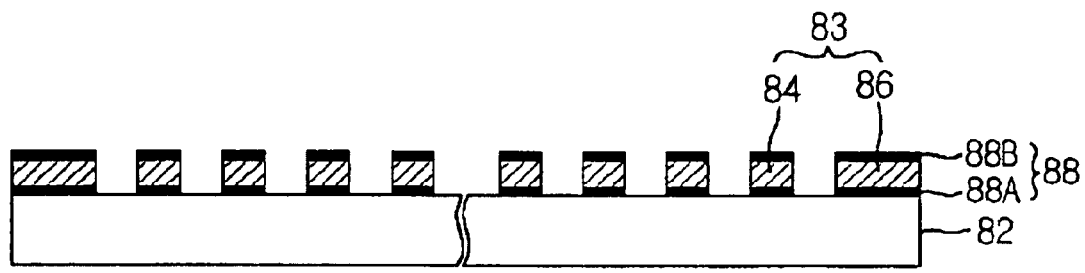
FIG. 7 is a cross-sectional view showing a structure of an EMI shielding filter according to a first embodiment of the present invention.

FIG. 7 is a cross-sectional view showing a structure of an EMI shielding filter according to a first embodiment of the present invention. As shown in FIG. 7, the EMI shielding filter includes an EMI shielding layer 83 formed of conductive meshes 84 and frames 86 for supporting the conductive meshes 84, and a base film 82 on which the EMI shielding layer 83 is formed.

The conductive meshes 84 of the EMI shielding layer 83 are positioned at an area where light (visible rays) from a display panel (e.g., a PDP) is transmitted, and secure transmittance and absorb electromagnetic waves emitted from the display panel. The frames 86 encompasses outside of the conductive meshes 84 to support the conductive meshes 84 and to form a discharge path for absorbed electromagnetic waves. The EMI shielding layer 83 formed of the conductive meshes 84 and the frames 86 are made from metals including silver (Ag) or copper (Cu).

The base film 82 supports the EMI shielding layer 83.

Also, a blackened layer 88 is formed on the surface of the metallic EMI shielding layer 83 to prevent light reflection. More specifically, the blackened layer 88 includes a first blackened layer 88A formed on a rear surface of the EMI shielding layer 83 to absorb a display light from the display panel, and a second blackened layer 88B formed on a front surface of the EMI shielding layer 83 to absorb an externally incident light. Therefore, the blackened layer 88 is useful for preventing the external light reflection and display light reflection by the EMI shielding layer 83, and as a result thereof, contrast ratio can be improved.

Here, the blackened layer 88 can be formed by oxidizing metals like Cu or Ni or oxidizing an alloy.

In addition, at least one of the first and second blackened layers 88A and 88B can be formed by oxidizing the EMI shielding layer 83.

A manufacturing method of the EMI shielding filter with the above structure will be now explained.

Figure 8A:
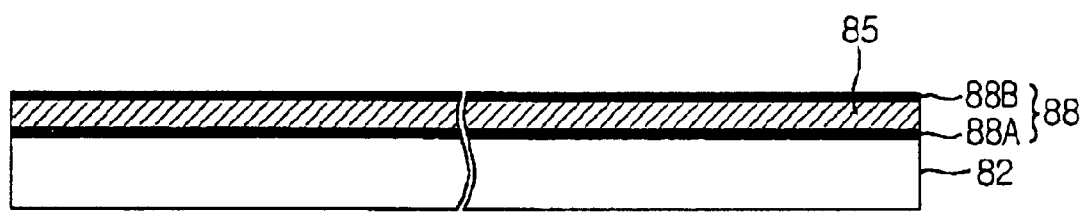
FIGS. 8A and 8B are cross-sectional views showing a step-by-step procedure for manufacturing an EMI shielding filter according to the present invention.

As shown in FIG. 8A, a base film 82 is first prepared, and then the first blackened layer 88A, a conductive layer 85 and the second blackened layer 88B are sequentially formed on the top of the base film 82. Here, the conductive layer 85 is formed through a deposition process like a sputtering. The first and second blackened layers 88A and 88B are formed through a screen printing, compound thin film coating, or electrochemical blackening process.

Figure 8B:
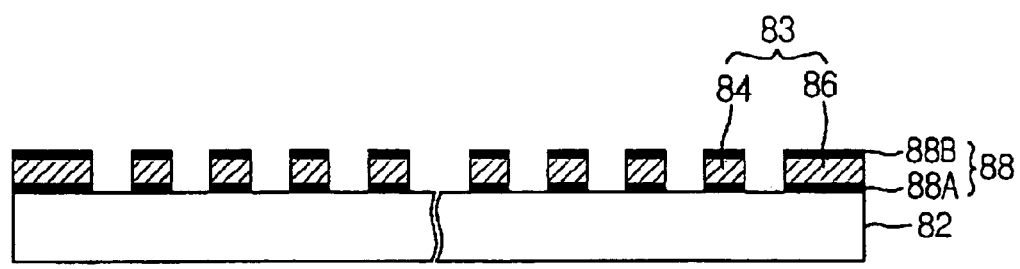

The second blackened layer 88B is coated with a photoresist, and the photoresist is patterned through a mask. In this manner, a photoresist pattern is formed on the frames and meshes. Using the photoresist pattern as a mask, the second blackened layer 88B, the conductive layer 85, and the first blackened layer 88A are patterned in like manner. Hence, as shown in FIG. 8B, the first and second blackened layers 88A and 88B are formed on the rear and front surfaces of the EMI shielding layer, that is on the rear and front surfaces of the conductive meshes 84 and frames 86, respectively. Lastly, any photoresist patterns remaining on the second blackened layer 88B are removed through a strip process.

Figure 9:
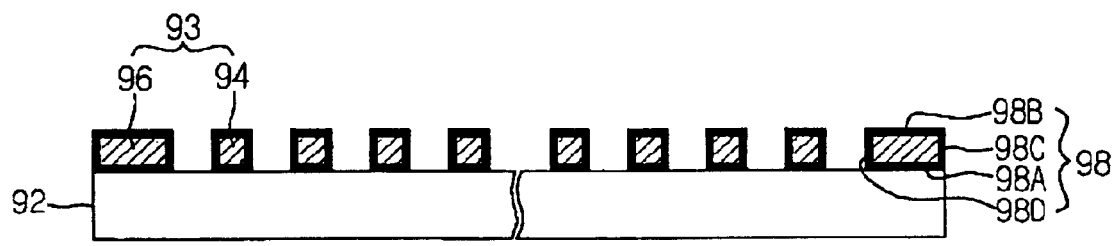
FIG. 9 is a cross-sectional view showing a structure of an EMI shielding filter according to a second embodiment of the present invention.

FIG. 9 is a cross-sectional view showing a structure of an EMI shielding filter according to a second embodiment of the present invention. As shown in FIG. 9, the EMI shielding filter includes an EMI shielding layer 93 formed of conductive meshes 94 and frames 96 for supporting the conductive meshes 94, and a base film 92 on which the EMI shielding layer 83 is formed.

The conductive meshes 94 of the EMI shielding layer 93 are positioned at an area where light (visible rays) from a display panel (e.g., a PDP) is transmitted, and secure transmittance and absorb electromagnetic waves emitted from the display panel. The frames 96 encompasses outside of the conductive meshes 94 to support the conductive meshes 94 and to form a discharge path for absorbed electromagnetic waves. The EMI shielding layer 93 formed of the conductive meshes 94 and the frames 96 are made from metals including silver (Ag) or copper (Cu).

The base film 92 supports the EMI shielding layer 93.

Also, a blackened layer 98 is formed on the surface of the metallic EMI shielding layer 93 to prevent light reflection. More specifically, the blackened layer 98 includes first through fourth blackened layers 98A through 98D that are formed on the front, rear and both side surfaces of the EMI shielding layer 93, respectively. The second blackened layer 98B formed on the front surface of the EMI shielding layer 93 absorbs an externally incident light, the first blackened layer 98A formed on the rear surface of the EMI shielding layer 93 absorbs a display light from the display panel, and the third and fourth blackened layers 98C and 98D formed on both sides of the EMI shielding layer 93 absorb the external light and the display light, respectively. Therefore, the blackened layer 98 is useful for preventing the external light reflection and display light reflection by the EMI shielding layer 93, and as a result thereof, contrast ratio can be improved.

A manufacturing method of the EMI shielding filter with the above structure will be now explained.

Figure 10A:
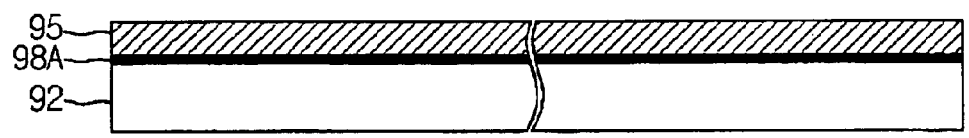
FIGS. 10A through 10C are cross-sectional views showing a step-by-step procedure for manufacturing an EMI shielding filter according to the present invention.

As shown in FIG. 10A, a base film 92 is first prepared, and then the first blackened layer 98A, and a conductive layer 95 are sequentially formed on the top of the base film 92. Here, the conductive layer 95 is formed through a deposition process like a sputtering. The first blackened layers 88A is formed through a screen printing or compound thin film coating process.

Figure 10B:
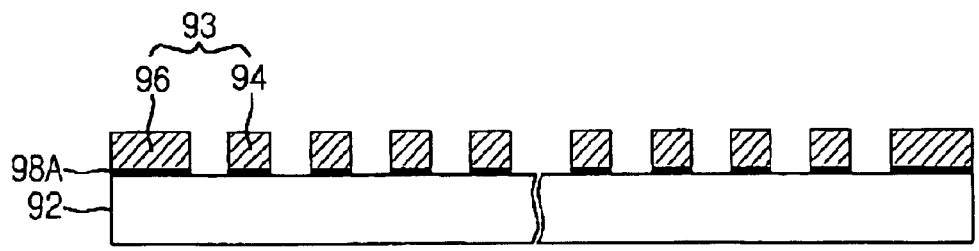

The conductive layer 95 is coated with a photoresist, and the photoresist is patterned through a mask. In this manner, a photoresist pattern is formed on the frames and meshes. Using the photoresist pattern as a mask, the conductive layer 95 and the first blackened layer 98A are patterned in like manner. Hence, as shown in FIG. 10B, the EMI shielding layer, that is, the conductive meshes 94 and frames 96, is formed on the base film 92, and the first blackened layer 98A is formed on the rear surfaces of the conductive meshes 94 and frames 96, respectively. Any photoresist patterns remaining on the conductive meshes 94 and frames 96 are removed through a strip process.

Figure 10C:
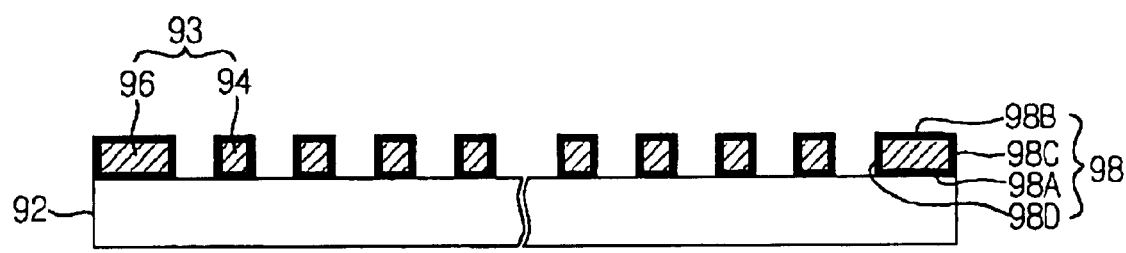

Referring to FIG. 10C, after the first blackened layer 98A is formed, the second through fourth blackened layers 98B through 98D are formed on the surface of the EMI shielding layer 93 formed of the conductive meshes 94 and frames 96. The second through fourth blackened layers 98B through 98D can be formed on the front and both side surfaces of the conductive meshes 94 and frames 96 through an electrochemical blackening, e.g., electroless plating, or screen printing or compound thin film coating process.

In conclusion, the EMI shielding filter and manufacturing method thereof can be advantageously used for preventing external light reflection and display light reflection by blackening the surface of the EMI shielding filter and thus, can improve contrast ratio of the display device.

While the invention has been shown and described with reference to certain preferred embodiments thereof, it will be understood by those skilled in the art that various changes in form and details may be made therein without departing from the spirit and scope of the invention as defined by the appended claims.

The foregoing embodiments and advantages are merely exemplary and are not to be construed as limiting the, present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A manufacturing method of an electromagnetic interference (EMI) shielding filter, the method comprising the steps of:

preparing a base film;

forming on the base film a first blackened layer and a conductive layer;

patterning the first blackened layer and the conductive layer by using a same mask, and forming on the rear surface of an EMI shielding layer a conductive pattern comprising the first blackened layer; and forming a second, third, and fourth blackened layer for encompassing a front surface and both side surfaces of the conductive pattern.

2. The method according to claim 1, wherein the second, third and fourth blackened layers are formed by an electroless plating, screen printing or thin film coating process.

* * * * *